US010429266B2

(12) United States Patent
Roth (10) Patent No.: US 10,429,266 B2
(45) Date of Patent: Oct. 1, 2019

(54) LEAK DETECTION IN A FLUID COMPRESSION SYSTEM (71) Applicant: TRANE INTERNATIONAL INC., Davidson, NC (US)

(72) Inventor: Robert J. Roth, LaCrosse, WI (US)

(73) Assignee: TRANE INTERNATIONAL INC., Davidson, NC (US)

( * ) Notice: Subject to any disclaimer, the term of this patent is extended or adjusted under 35 U.S.C. 154(b) by 122 days.

(21) Appl. No.: 15/793,354

(22) Filed: Oct. 25, 2017

(65) Prior Publication Data

US 2018/0120194 A1 May 3, 2018

Related U.S. Application Data (60) Provisional application No. 62/415,188, filed on Oct. 31, 2016.

(51) Int. Cl.
G01M 3/28 (2006.01)
G05D 7/06 (2006.01)
H05K 1/02 (2006.01)
H05K 7/20 (2006.01)
F25B 49/00 (2006.01)

(52) U.S. Cl.
CPC ......... *G01M 3/2815* (2013.01); *F25B 49/005* (2013.01); *G05D 7/0623* (2013.01); *H05K 1/0201* (2013.01); *H05K 7/20354* (2013.01); *F25B 2500/19* (2013.01); *F25B 2500/222* (2013.01); *F25B 2700/195* (2013.01); *F25B 2700/197* (2013.01); *H05K 7/20309* (2013.01); *H05K 7/20318* (2013.01); *H05K 2201/064* (2013.01)

(58) Field of Classification Search
CPC ............... F25B 49/005; F25B 2500/19; F25B 2500/222; F25B 2700/195; F25B 2700/197; G01M 3/2815; G05D 7/0623; H05K 1/0201; H05K 7/20354; H05K 7/20309; H05K 7/20318; H05K 2201/064
See application file for complete search history.

(56) References Cited

U.S. PATENT DOCUMENTS 4,417,451 A * 11/1983 Spauschus ............... F25B 43/04
62/129
5,031,410 A * 7/1991 Plzak .................... F25B 43/043
62/475
5,636,526 A * 6/1997 Plzak .................... F25B 15/008
62/475

(Continued)

*Primary Examiner* — David A Rogers
(74) *Attorney, Agent, or Firm* — Hamre, Schumann, Mueller & Larson, P.C.

(57) ABSTRACT

Methods and systems for leak detection in a fluid compression system using a purge system are disclosed herein. In an embodiment, a method for detecting leaks includes determining, during a period of vacuum, a purge exhaust rate of non-condensables from a purge system integrated with a chiller unit. The method includes determining a differential pressure, the differential pressure based on a vacuum side pressure of the chiller unit, where the vacuum side pressure includes at least one of a pressure of a condenser and pressure of an evaporator. The method includes calculating, via a controller, the purge exhaust rate and the differential pressure to identify a leak size based at least in part on the purge exhaust rate.

20 Claims, 4 Drawing Sheets (56) References Cited

U.S. PATENT DOCUMENTS

| | | | | |
|---|---|---|---|---|
| 2003/0192332 A1* | 10/2003 | Heiden | ............... | F25B 43/043 |
| | | | | 62/195 |
| 2011/0218771 A1* | 9/2011 | Seigel | ............... | F24F 11/30 |
| | | | | 702/182 |
| 2013/0133359 A1* | 5/2013 | Ueda | ............... | F25B 31/004 |
| | | | | 62/471 |
| 2013/0283830 A1* | 10/2013 | Jandal | ............... | F25B 43/003 |
| | | | | 62/85 |
| 2014/0165626 A1* | 6/2014 | Van Horn | ............... | C09K 5/044 |
| | | | | 62/79 |
| 2015/0197677 A1* | 7/2015 | Kontomaris | ............... | C09K 5/045 |
| | | | | 62/77 |
| 2016/0175740 A1* | 6/2016 | Stark | ............... | F25B 43/04 |
| | | | | 95/22 |
| 2017/0029679 A1* | 2/2017 | Van Horn | ............... | C09K 5/044 |
| 2018/0073785 A1* | 3/2018 | Jonsson | ............... | C10M 171/008 |
| 2018/0127957 A1* | 5/2018 | Enev | ............... | E03B 7/071 |

* cited by examiner

LEAK DETECTION IN A FLUID COMPRESSION SYSTEM

FIELD

This disclosure relates generally to leak detection. More specifically, this disclosure relates to systems and methods for leak detection in a fluid compression system, where the fluid compression system is a heating, ventilation, air conditioning, and/or refrigeration (HVACR) system, which can include a chiller unit using a purge system.

BACKGROUND

Refrigerants, coolants, and/or blends of working fluid circulate through a cooling circuit, for example, a heating, ventilation, air conditioning, and/or refrigeration (HVACR) system, which may include a chiller unit. Leaks within a chiller unit can damage the system, compromise efficiency, and/or cause environmental problems. Refrigerant leak inspection generally includes an electronic leak detection wand, bubble test, and/or a visual inspection for oil. Air leaks into a unit of a low pressure chiller may be identified through pressurizing the chiller by heating the refrigerant such that it has positive pressure.

SUMMARY

This disclosure relates generally to leak detection. More specifically, this disclosure relates to systems and methods for leak detection in a fluid compression system, where the fluid compression system is a heating, ventilation, air conditioning, and/or refrigeration (HVACR) system, which can include a chiller unit using a purge system.

A chiller unit can have two sides: a condenser side and an evaporator side. The two sides of the chiller unit can both or individually operate at high pressure and/or low pressure. For example, a chiller unit can include a condenser side that operates at high pressure and an evaporator side that operates at low pressure. Due to the pressurization of the chiller unit, a leak may form in one or both sides of the chiller unit. A leak can be an air leak or a working fluid emission leak. The location of the leak on the chiller unit determines the effect of the leak upon the chiller unit.

A leak associated with the evaporator may be an air leak, which may cause non-condensables to enter the chiller unit. A purge system can remove the non-condensables to prevent damage and/or inefficiencies. Typically, a leak associated with the evaporator is not cause for concern due to the slow nature of the leak and the implementation of the purge system.

Additionally, or alternatively, a leak may be associated with the condenser. A leak associated with the condenser may be a working fluid emission leak, such as refrigerant, outside of the chiller unit. In some cases, a leak on the condenser can cause more damage than a leak on the evaporator due to the external leakage. Refrigerant leaving the chiller unit via the condenser side leak can be damaging to the environment and/or chiller compliance operational requirements.

In some embodiments, the condenser can operate at high pressure/positive pressure while the evaporator can operate at negative pressure/low pressure. Naturally, working fluid travels from areas of high pressure to areas of low pressure. While air may leak into the evaporator that operates at low pressure, refrigerant may leak outside of the chiller unit via a leak on the condenser that operates at high pressure. As such, a leak in the condenser can indicate that working fluid may be leaking outside of the chiller unit.

Working fluid leaking from a condenser is cause for concern due to environmental, safety, and/or governmental regulations. As such, leak detection in a fluid compression system that determines the particular location, leak size, and/or working fluid emission rate would be beneficial, for example, to identify whether a leak may pose a threat and/or violates environmental, safety, and/or governmental limitations.

As disclosed herein, systems and methods for leak detection in a fluid compression system are described. In an embodiment, the systems and methods described herein can determine a leak size, for example, on a low or high side of the chiller unit and estimate an emissions rate associated with the leak size. The systems and methods described herein can provide a tangible approach and/or objective manner to describe leaks with respect to refrigerant emissions associated with a chiller unit. Leak detection can be performed annually or continuously, which can translate into cost savings when appropriate actions are taken in response to the leak detection.

In an embodiment, a method for detecting leaks includes determining, during a period of vacuum, a purge exhaust rate of non-condensables from a purge system integrated with a chiller unit. The method includes determining a differential pressure, the differential pressure based on a vacuum side pressure of the chiller unit, where the vacuum side pressure includes at least one of a pressure of a condenser and pressure of an evaporator. The differential pressure is the pressure of the vessel that is being measured (e.g., the chiller unit or a particular vessel thereof) as compared to the pressure of the surrounding atmosphere (e.g., outside of the chiller unit). The method includes calculating, via a controller, the purge exhaust rate and the differential pressure to identify a leak size based at least in part on the purge exhaust rate.

In an embodiment, a leak detection system includes a purge system connected to a chiller circuit. The purge system operates in a vacuum and includes a purge exhaust rate. The system includes a first pressure sensor associated with a condenser associated with the chiller circuit, a second pressure sensor associated with an evaporator associated with the chiller circuit, and a controller in electrical communication with the first and second pressure sensors that calculates a differential pressure to atmospheric pressure. The controller determines a condenser leak size based at least in part on the differential pressure. The controller calculates a working fluid emission rate based on the differential pressure and the condenser leak size.

BRIEF DESCRIPTION OF THE DRAWINGS

Reference is now made to the drawings in which life reference numbers represent corresponding parts throughout.

DETAILED DESCRIPTION

Working fluid leak inspection of a fluid compression system, such as a chiller unit as part of a heating, ventilation, air conditioning, and/or refrigeration (HVACR) system, can traditionally be conducted by an electronic leak detection wand, a bubble test, or a visual inspection for oil.

A fluid compression system, such as a HVACR system which may include a chiller unit, may operate at pressures below an atmospheric level (e.g., low pressure chiller unit) and may experience an accumulation of non-condensable gases and/or other contaminants within the chiller unit. For example, when the chiller unit operates under vacuum, as referenced to the surrounding atmosphere, the chiller unit has a particular temperature and negative pressure. As such, if a leak is present in the chiller unit, air and/or other non-condensables may enter the chiller unit due to the associated negative pressure, which can contribute to an accumulation of non-condensables.

A low-pressure chiller unit can be a centrifugal chiller type refrigeration system in which one or both sides of the system operate(s) in vacuum, while the condenser and/or evaporator operate at slightly negative pressure relative to the surrounding atmosphere. Leaks in a low pressure chiller unit that is operating in vacuum may draw in atmospheric air, moisture, and/or other non-condensables.

For a low pressure chiller unit, leaks into a chiller unit can be identified by first pressurizing the chiller unit by heating the working fluid of a unit, such as refrigerant, such that it has a positive pressure. The heating of the working fluid can be a slow process, using either difficult to use temporary heaters and/or expensive unit mounted heaters. Additionally, once the chiller unit is pressurized, a diligent inspection can be a physically difficult and/or time consuming task. In some cases, pressurized leak detection, as described above, may identify leak paths that falsely suggest maintenance repair because the leak detection test(s) cannot identify whether the leak is inside or outside of the chiller unit.

Systems and methods for leak detection in a fluid compression system, such as a chiller unit as part of a HVACR system, using a purge system, are described herein. Leak detection may be performed via controlling and/or monitoring a purge system for non-condensable infiltration, such as through leak paths, while the chiller unit or particular sides thereof, are in vacuum.

The accumulation of non-condensables may reduce efficiency of the chiller unit. Generally, a purge system can be used to remove the non-condensables (e.g., gas) that may accumulate in the chiller unit. The purge system for a chiller unit can remove air, moisture, and/or other non-condensables from the chiller unit by causing refrigerant vapor in the chiller unit to condense in a purge tank. As a result of its undergoing a heat exchange relationship with a second and different working fluid, such as for example, another refrigerant employed in a refrigeration circuit of the purge system. Refrigerant can be returned to the system, and the resulting non-condensables can then be removed from the chiller unit via an exhaust.

In some low pressure chiller units, leaks may be of two different types: air leaking into the chiller unit or working fluid leaking out of the chiller unit. Leaks may occur, for example, when air enters the low pressure side (e.g., evaporator) and/or working fluid leaking out of the high pressure side (e.g., condenser). Leaks can take the form of a combination of leak paths, such as leaks around a gasket, a physical entry, opening into the system, and/or a compromised area of the chiller unit. The combination of leak paths can be characterized as an "orifice" of a particular "sized" leak (e.g., leak paths can be summed to be characterized as equivalent to a leak size that is at thousandths of an inch).

In some embodiments, air that leaks into the chiller unit via a leak path can result in approximately $1/10^{th}$ a refrigeration emission when the non-condensables (e.g., air, etc.) are removed via a purge system as compared to the same leak path in which heat transfer fluid (e.g., refrigerant) is leaking out of the chiller unit. While an air leak may not substantially impact operation and/or significant emissions of the chiller unit, working fluid leaking outside of the chiller unit may need to be addressed quickly to prevent damage and/or violation of environmental emission standards (e.g., the Environmental Protection Agency (EPA), governmental, etc.). It would be beneficial to identify leak paths that may result in comparatively low emission (e.g., an air leak inside the chiller unit) and higher emission leak paths (e.g., working fluid leak outside the chiller unit).

As described herein, leak detection in a fluid compression system can identify a leak size and an associated emission rate. A leak size is not necessarily a physical "hole" or an "orifice," but can be a number of leak "paths," locations, openings, and/or entries in the system. Leak detection in a vacuum can be used to identify a location of a leak (e.g., evaporator or condenser) and/or quantify a leak size in a chiller unit. A working fluid (e.g., refrigerant) emission rate associated with the chiller can identify when a chiller unit has an acceptable leak integrity and/or whether a leak repair is warranted.

Figure 1:
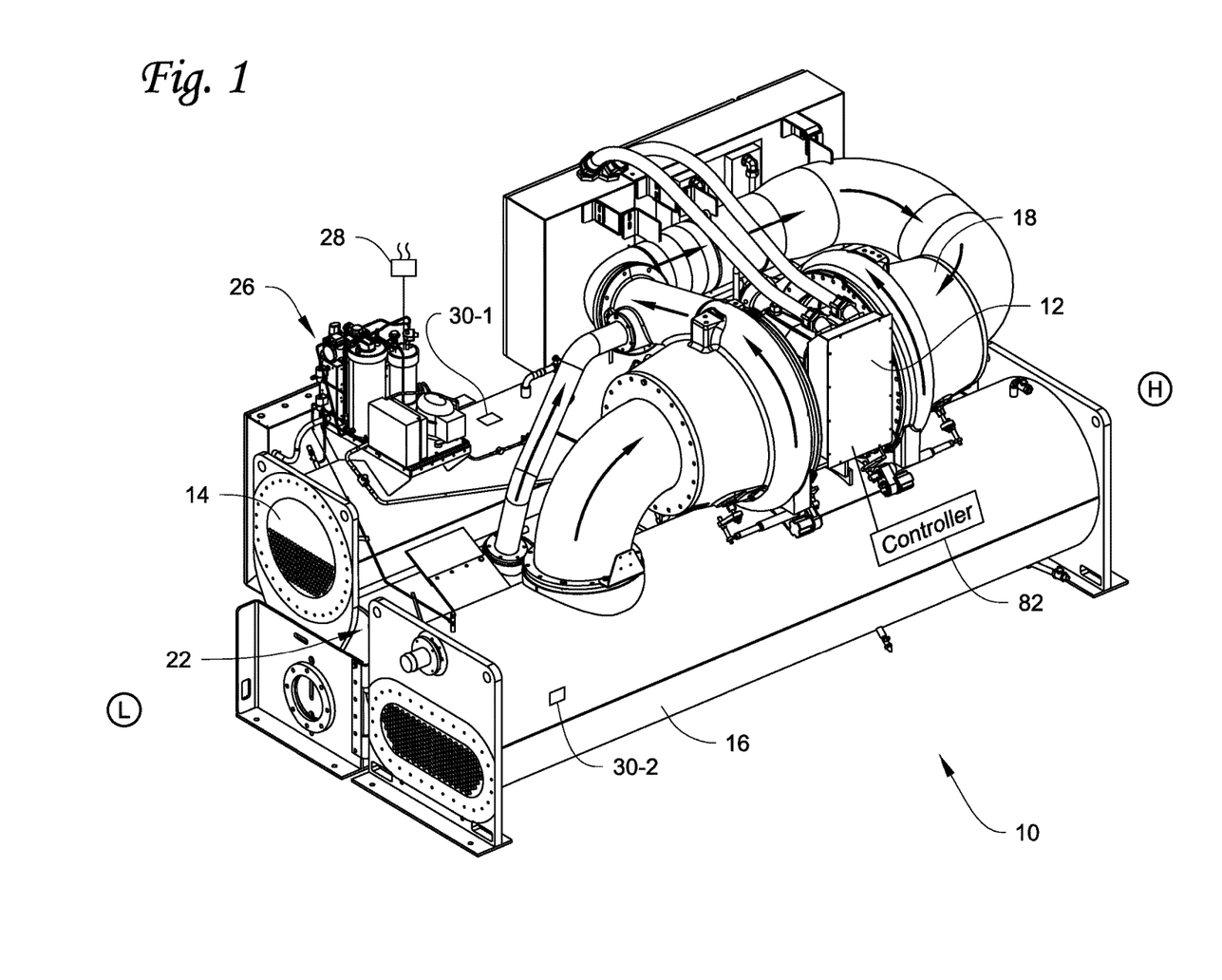
FIG. 1 illustrates a perspective view of a fluid compression system, according to an embodiment.

FIG. 1 is a perspective view of a fluid compression system, according to an embodiment. The fluid compression system can be a chiller unit 10 as part of a heating, ventilation, air conditioning, and refrigeration (HVACR) system.

The chiller unit 10 includes among other features, a compressor 18 fluidly connected to a condenser 14, which is fluidly connected to an expansion device (not shown), which is fluidly connected to an evaporator 16, and which is fluidly connected to the compressor 18 in a cooling circuit. The chiller unit 10 may also include an economizer 22 which is fluidly connected to the compressor 18. The chiller unit 10 is exemplary and can be modified to include additional components. For example, in an embodiment the chiller unit 10 can include one or more flow control devices, a receiver tank, a dryer, a suction-liquid heat exchanger, or the like.

The chiller unit 10 can be provided with an amount of working fluid for use in the fluid compression system. In an embodiment, the working fluid used in the fluid compression system can be a heat transfer fluid, such as a refrigerant, which is in a heat exchange relationship with one or more process fluids, such as, but not limited to, water, to cool or chill the water for other use or applications, such as, but not limited to, in comfort cooling applications. An original charge (e.g., amount of working fluid, refrigerant, etc.) can be provided in the chiller unit 10 for cooling applications. The original charge is a finite amount of working fluid that can be provided to the chiller unit 10 based on a particular capacity associated with the chiller unit 10.

A two-stage centrifugal compressor 18 is illustrated in FIG. 1. It is to be understood that the compressor 18 can alternatively be a single-stage centrifugal compressor, a three-stage centrifugal compressor, or other suitable multi-stage centrifugal compressor. The disclosed embodiments may also be suitable for other types of compressors.

In an embodiment, a lubricant tank assembly (not shown) can be included for managing lubricant. In general, a lubricant draining from one or more bearings can be returned to the lubricant tank assembly via one or more drain lines. A lubricant separator can be included in the lubricant tank assembly to improve separation of lubricant and working fluid such that the lubricant and working fluid may be reused in the chiller unit 10.

The chiller unit 10 may also include a control system 12 to control operation of the chiller unit 10. The control system 12 can be a combination of hardware and software, but at least includes hardware. The control system 12 can include a display and/or identify the location of detected leaks, as discussed further herein.

The control system 12 can include a programmable controller 82 that includes, for example, a single integrated control unit. It will be appreciated that in other embodiments, the controller 82 may include a distributed network of control elements (not shown). The number of distributed control elements in a given network can depend upon the particular application of the principles described in this specification. The controller 82 can include a processor, a memory, a clock, and an input/output (I/O) interface (not shown). The controller 82 can include fewer or additional components. The controller 82 can be configured to control a water temperature to obtain various operating settings (e.g., temperature, humidity, air quality, etc.) for comfort cooling applications.

As previously described, a low-pressure chiller unit 10 can be a centrifugal chiller type refrigeration system that operates under a vacuum in the evaporator 16 side of the system, while the condenser 14 and/or compressor 18 operate at slightly positive pressure relative to the surrounding atmosphere. In some embodiments, the chiller unit 10 can operate under vacuum in the condenser 14 side of the system, while the evaporator 16 operates at a slightly positive pressure relative to the surrounding atmosphere. Leaks in a low pressure chiller unit 10 that is operating in vacuum may draw in atmospheric air, moisture, and/or other non-condensables.

The chiller unit 10 can include a plurality of vacuum conditions. A vacuum condition is when one or both of the sides of the chiller unit 10 are in vacuum. The plurality of vacuum conditions associated with the chiller unit 10 can include operating, idle, free cooling, or no vacuum. The chiller unit 10 can be switched from one vacuum condition to another vacuum condition. Although four vacuum conditions are discussed herein, additional or fewer vacuum conditions may be associated with a chiller unit 10. The vacuum conditions are discussed in detail below.

When the chiller unit 10 is in an operating vacuum condition, the evaporator 16 may be in a vacuum. When the evaporator 16 is in vacuum, the evaporator 16 may have a low pressure, low temperature, and/or a negative pressure relative to the surrounding atmosphere (e.g., external to the vessel), while the condenser 14 may have a high pressure, high temperature, and/or a positive pressure relative to the surrounding atmosphere.

When the vacuum condition of the chiller unit 10 is operating, if a leak is present in the evaporator 16 (e.g., the low pressure side), non-condensables can enter the chiller unit 10. If a leak is present in the condenser 14 (e.g., high pressure side), working fluid can leak out of the system due to the positive pressure of the condenser 14 relative to the relative to the surrounding atmosphere. Additionally, or alternatively, if a leak is present on the evaporator 16 (e.g., low pressure side), air/non-condensables can leak into the system due to the negative pressure of the evaporator 16 relative to the surrounding atmosphere. The loss of refrigerant is inefficient for the chiller unit 10 and can be environmentally problematic.

When the vacuum condition of the chiller unit 10 is idle, the evaporator 16 and the condenser 14 may both be under complete vacuum. A complete vacuum is when both sides of the chiller unit 10 are operating at a negative pressure (e.g., negative inches of vacuum). In other words, the chiller unit 10 can be in negative pressure (e.g., low pressure) relative to the atmosphere outside of the chiller unit 10 that may be positive pressure (e.g., high pressure). Since particles travel from high pressure to low pressure, air and/or non-condensables can travel into the chiller unit 10.

When the vacuum condition of the chiller unit 10 is free cooling, it is possible that the condenser 14 may be in vacuum. When the condenser 14 is in vacuum, the condenser 14 may have a low pressure, low temperature, and/or a negative pressure relative to the surrounding atmosphere, while the evaporator 16 may have a high pressure, high temperature, and/or a positive pressure relative to the surrounding atmosphere. If a leak is present in the evaporator 16 (e.g., high pressure side), working fluid can leak out of the system due to the positive pressure of the evaporator 16 relative to the surrounding atmosphere. Additionally, or alternatively, if a leak is present on the condenser 14 (e.g., low pressure side), air/non-condensables can leak into the system due to the negative pressure of the condenser 14 relative to the positive pressure outside of the condenser 14.

In an embodiment, the chiller unit 10 can have no vacuum condition. That is, neither side of the chiller unit 10 is under vacuum. When the chiller unit 10 is not under vacuum (e.g., no vacuum is applied to either side) the chiller unit 10 can be in a positive pressure. Both the evaporator 16 and condenser 14 can have a positive pressure when not under vacuum. When the chiller unit 10 is not under vacuum, there may be no pressure difference within the chiller unit 10. For example, the condenser 14 and the evaporator 16 can have the same (e.g., equal) pressures. The chiller unit 10 can have a positive pressure (e.g., high pressure) while the surrounding/external atmosphere is a negative pressure (e.g., low pressure).

When the chiller unit 10 has no vacuum condition, the chiller unit 10 can include a plurality of piping (not shown). The plurality of piping can be used to introduce cold fluid to the chiller unit 10 heat exchanger(s) to chill the working fluid and create positive pressure. For example, chilled water can be circulated through the chiller evaporator 16 to cool the working fluid and result in a total vacuum of the entire chiller unit 10, including the condenser 14, compressor 18, and evaporator 16.

In an embodiment, a purge system 26 is connected to the condenser 14 in a chiller unit 10. The purge system 26 can remove the atmospheric air and/or non-condensables. The purge system 26 separates the non-condensables from the working fluid (e.g., refrigerant). The non-condensables can be vented through an exhaust vent 28. In some embodiments, the purge system 26 can collect working fluid caught in the purge system 26 by condensing the refrigerant, thereby returning the working fluid to the system. Any remaining non-condensables, such as atmospheric air, can be vented via the exhaust vent 28.

The purge system 26 includes a purge amount. The purge amount can be the amount of non-condensables, working fluid, other fluids (e.g., oil), or a combination thereof vented through the exhaust vent (e.g., 28 in FIG. 1). The purge amount can be measured in pounds (e.g., lbs.). The purge amount can be measured by a sensor and/or a controller 82 associated with a purge system of the chiller unit 10.

The purge system 26 can include a purge exhaust rate (e.g., pounds/time) and a purge efficiency (e.g., pounds). The purge exhaust rate is the amount of non-condensables vented through the exhaust vent over a period of time. The purge efficiency is the pound(s) of working fluid lost per pound of non-condensables exhausted. The purge exhaust rate and the purge efficiency can be used to calculate a purge emission. The purge emission of working fluid can be calculated by multiplying the non-condensable exhaust rate by the purge efficiency. The purge amount and/or purge exhaust rate can be known and/or measured by a sensor and/or a controller 82 associated with the purge system 26.

The purge system 26 can be in any of the chiller unit 10 vacuum conditions, described above. The purge system 26 can purge non-condensables in any of the vacuum conditions. The vacuum can operate under pounds per square inch vacuum (PSIV). Operating the purge system 26 under a vacuum can provide calibrated measurements of purge exhaust rates.

When a leak occurs on a high pressure side of the chiller unit 10, the purge system 26 may experience a decreased purge amount than when the leak is on a low pressure side. For example, when a leak is on the evaporator 16 whose operating pressure is less than surrounding atmospheric pressure (e.g., low pressure side of the chiller unit 10) may result in non-condensables leaking into the chiller unit 10 and an increased purge amount. In comparison, when a leak is on the condenser 14 whose operating pressure is higher than the surrounding atmospheric pressure (e.g., high pressure side of the chiller unit 10), where a leak can result in the working fluid leaking to the surrounding atmosphere, the purge system 26 may not have non-condensables to expel. In other words, when the evaporator 16 is in vacuum (e.g., low pressure) and the condenser 14 is not in vacuum (e.g., it has a high pressure relative to the surrounding atmosphere), a purge amount may be decreased compared to when the evaporator 16 and the condenser 14 are both in vacuum. The purge system 26 may purge more when both sides are in vacuum because the non-condensables are leaking into the chiller unit 10 instead of working fluid leaking out via a leak path on the high pressure side (e.g., condenser 14) of the chiller unit 10.

The leak detection system further includes a plurality of sensors 30-1, 30-2 to determine pressure. The sensors 30-1, 30-2 are generally referred herein as the plurality of sensors 30. One or more of the plurality of sensors 30 can measure a pressure of the chiller unit 10 and/or for each side of the chiller unit (e.g., condenser 14 and evaporator 16). In an embodiment, the plurality of sensors 30 can be a plurality of transducers.

The plurality of sensors 30 of the chiller unit 10 can include a first sensor 30-1 that is associated with the condenser 14 and a second sensor 30-2 that is associated with the evaporator 16. The first sensor 30-1 can measure a pressure associated with the condenser 14 of the chiller unit 10. The second sensor 30-2 can measure a pressure associated with the evaporator 16 of the chiller unit 10. For example, the first pressure sensor 30-1 can measure a first pressure associated with the condenser 14, and/or the second pressure sensor 30-2 can measure a second pressure associated with the evaporator 16.

Although two sensors are depicted in FIG. 1, additional or fewer sensors to determine pressure may be included in an embodiment. In some embodiments, there can be additional sensors (not shown) to measure additional pressure. For example, a third sensor (not shown) may be positioned outside of the chiller unit 10 to measure an external pressure outside of the chiller unit 10.

In an embodiment, a differential pressure can be determined for a chiller unit 10. Differential pressure is the pressure of a vessel of the chiller unit 10 in a vacuum condition relative to an external pressure. That is, differential pressure is the pressure difference between the chiller unit 10, condenser 14, and/or evaporator 16 and the outside ambient conditions. Ambient conditions are pressures external (e.g., outside) of the chiller unit 10, such as, for example, atmospheric pressure.

In an embodiment, the differential pressure is the pressure of the vessel in vacuum that is being measured (e.g., the chiller unit 10 as a whole which is comprised of the condenser 14 and the evaporator 16) as compared to the pressure of the external atmosphere (e.g., outside of the vessel). The one or more of the plurality of sensors 30 can measure a differential pressure of a respective high and low side of the chiller unit 10 as compared to the pressure of the external atmosphere (e.g., outside of the chiller unit 10/vessel).

By way of example, when the chiller unit 10 is in an idle vacuum condition, the chiller unit 10 is under complete vacuum, meaning both the condenser 14 and the evaporator 16 are in vacuum. The differential pressure can be the pressure difference between the chiller unit 10 as compared to pressure outside the chiller unit 10. When both the condenser 14 and the evaporator 16 are in vacuum, the first pressure (e.g., condenser 14) as measured by the first sensor 30-1 and the second pressure (e.g., evaporator 16) as measured by the second sensor 30-2. As these pressures can be equal in an idle vacuum condition, either side as compared to the pressure of the external atmosphere (e.g., outside the chiller unit 10) can be used to calculate the differential pressure of the chiller unit 10.

Additionally, or alternatively, when the chiller unit 10 has no vacuum condition, the evaporator 16 may be in positive pressure relative to the atmosphere and the condenser 14 may be in positive pressure relative to the atmosphere. When the chiller unit 10 has a positive pressure (e.g., high pressure), refrigerant can leak out of the chiller unit 10 toward the outside ambient conditions (e.g., positive pressure; high pressure), as discussed further herein with respect to FIG. 4.

The control system 12 (e.g., programmable controller, etc.), as previously described, can be in electrical communication with the plurality of sensors 30 and calculates the differential pressure based on pressures associated with the respective pressure sensors (e.g., 30-1, 30-2) and the surrounding atmosphere. The control system 12 can send signals to and receive signals from the chiller unit 10 for particular operations, such as the purge system 26.

As discussed further herein, the leak detection systems and methods can determine a leak size, the location of the leak on the chiller unit 10, and/or calculate a working fluid (e.g., refrigerant) emission rate of the chiller unit 10 based on differential pressure, purge exhaust rate of the purge system 26, and characteristics of the non-condensables.

Figure 2:
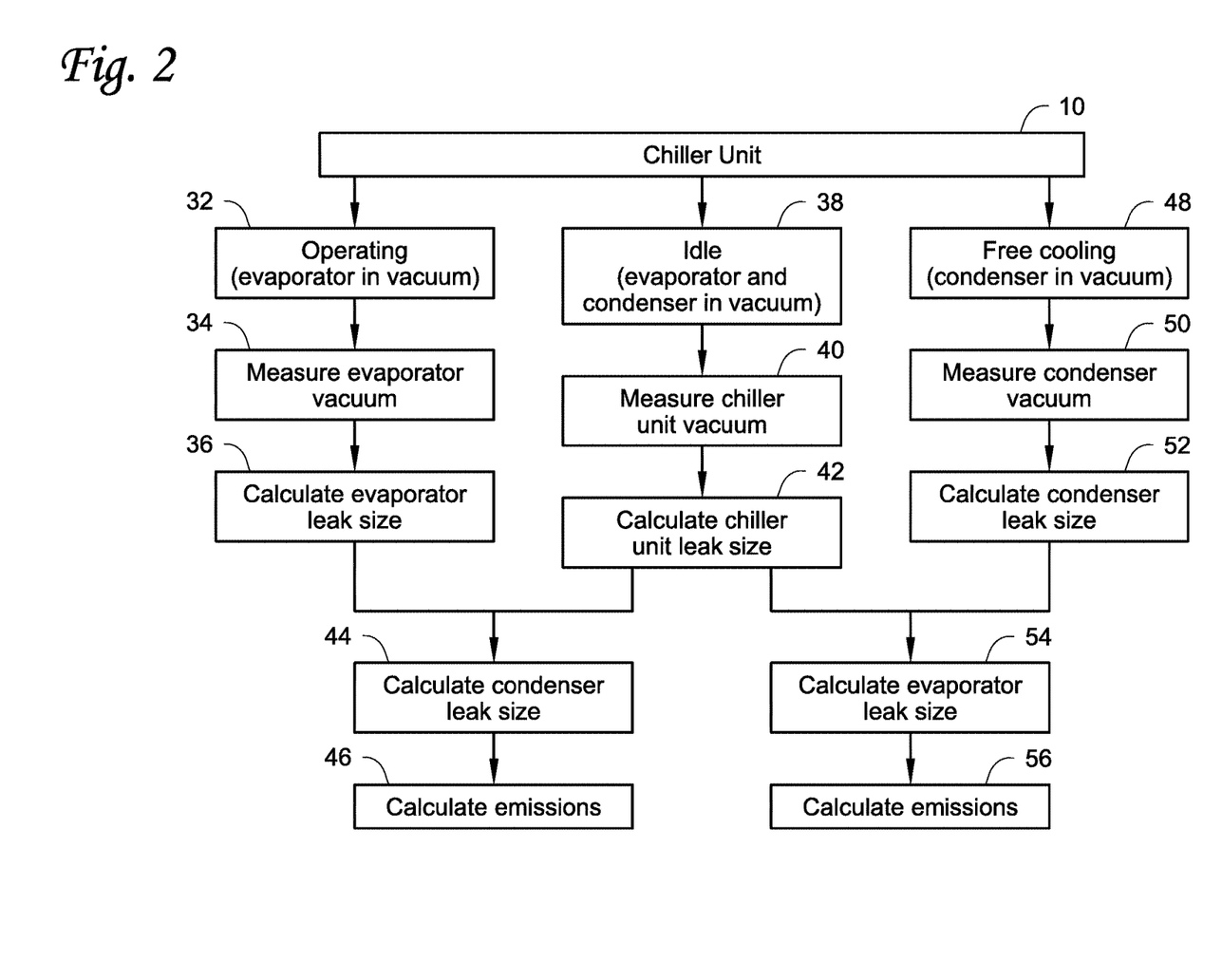
FIG. 2 illustrates a flow diagram of leak detection in a fluid compression system, according to an embodiment.

FIG. 2 illustrates a flow diagram of leak detection in a fluid compression system, according to an embodiment. In particular, FIG. 2 depicts a flow diagram of a plurality of vacuum conditions, including operating 32, idle 38, and free cooling 48, to determine a leak size.

Generally, a leak size can be determined for each of the evaporator, condenser, and the chiller unit as a whole based on the differential pressure, purge exhaust rate, and characteristics of the non-condensables. Once the leak size is determined for the entire chiller unit, a leak size can be imputed to a side of the chiller unit by comparing the non-condensable leak rate of the chiller unit in complete vacuum as compared to when one, but not both, the evaporator and condenser are in vacuum.

The flow diagram illustrated in FIG. 2 includes a chiller unit 10. Features of the chiller unit 10 can be the same as or similar to aspects of the chiller unit 10 of FIG. 1. For simplicity of this specification, features previously described will not be described in further detail.

The chiller unit 10 can include two sides (e.g., the evaporator side and the condenser side, as previously discussed with respect to FIG. 1). The two sides of the chiller unit can operate in vacuum independently and/or collectively. The vacuum condition of the chiller unit 10 can control whether the evaporator, condenser, or both, are in vacuum. To determine a leak size for a respective side of the chiller unit 10, the vacuum condition of the chiller unit 10 may be idle 38, operating 32, or free cooling 48.

To determine a leak size associated with the condenser (e.g., 14 in FIG. 1), the chiller unit 10 may include first and second vacuum conditions, the first vacuum condition being operating 32 and the second vacuum condition being idle 38. For example, the chiller unit 10 may first be in an idle 38 vacuum condition and then the operating 32 vacuum condition second.

When operating 32, the chiller unit 10 may have the evaporator under vacuum, whereas a chiller unit 10 that is idle 38 may have both the evaporator and condenser under vacuum. Using these two vacuum conditions (e.g., operating 32 and idle 38), a leak size can be imputed to the condenser of the chiller unit 10 by comparing the non-condensable leak rate of the chiller unit 10 in complete vacuum as compared to the non-condensable leak rate when the evaporator is in vacuum.

At box 32, the vacuum condition of the chiller unit 10 is operating. When operating 32, the evaporator (e.g., 16 in FIG. 1) is operating in a vacuum, (e.g., negative pressure). When the chiller unit 10 is operating, the condenser (e.g., 14 in FIG. 1) may not be under vacuum.

The vacuum difference can create different pressurized environments between the two sides of the chiller unit 10. The evaporator in vacuum can create a low pressure environment (e.g., negative pressure), while the condenser can be a high pressure environment (e.g., positive pressure) relative to the surrounding atmosphere. When operating 32, the evaporator and the condenser are no longer coupled; meaning the evaporator and the condenser are both no longer in the same vacuum. The evaporator is in negative pressure, while the condenser is in positive pressure.

At box 34, the evaporator vacuum and purge exhaust rate can be measured. The pressure associated with the evaporator under vacuum can be measured via one or more of the plurality of sensors (e.g., 30), as previously discussed with respect to FIG. 1. The evaporator vacuum can be measured by the sensor or pressure transducers to determine a pressure associated with the evaporator. The evaporator vacuum can be measured in units of pounds per square inch vacuum (PSIV).

As previously described, the purge system can operate in any of the vacuum conditions and can remove non-condensables from the chiller unit 10. The purge system can include a purge amount and a purge exhaust rate. The purge amount is the amount of non-condensables, working fluid, other fluids (e.g., oil), or a combination thereof vented from the purge system via the exhaust vent. The purge system can include a calculated purge emission rate (e.g., working fluid loss; pounds/time) based on the measured purge exhaust rate as factored by a purge efficiency and time. In other words, the purge emissions (e.g., working fluid loss through the purge) is the purge exhaust rate (e.g., pounds) of non-condensables vented (e.g., emitted) through the exhaust vent by the purge system factored by the particular purge emission efficiency within a period of time.

At box 36, when the chiller unit is operating and the evaporator is in vacuum, a leak size associated with the evaporator can be calculated. The leak size is the combination of the leak paths which can be characterized in a manner that is similar to a particular leak size for a period of time. The leak size associated with the evaporator can be a steady state situation. The leak size associated with the evaporator can be calculated based on the differential pressure, purge exhaust rate, and characteristics of the non-condensables. Each of these aspects can be known, and/or determined by a sensor and/or calculation. These features are discussed in detail as follows.

The differential pressure of the evaporator can be determined by one or more of the plurality of sensors or pressure transducers (e.g., 30 in FIG. 1). A sensor (e.g., second sensor 30-2 in FIG. 1) can measure a pressure associated with the evaporator. The evaporator pressure can be compared to a pressure outside of the chiller unit, such as the external atmosphere. The differential pressure is the difference between the two pressures. For example, the differential pressure of the evaporator is the difference between the pressure associated with the evaporator (e.g., low side differential) and the pressure of the external atmosphere. The difference between the two pressures can be the differential pressure of the evaporator under vacuum.

The purge exhaust rate is the amount of non-condensables vented from the purge system via the exhaust vent over a period of time (e.g., box 34). The purge system can include purge factors. The purge factors can operate on a set of known factors, such as efficiency of the purge. The purge efficiency can indicate the amount of working fluid lost by the purge per pound of non-condensables removed from the chiller unit. The purge system is generally an efficient system. The purge amount can be, in some instances, 0.02 pounds of non-condensables per pound of air (e.g., approximately 98% or better efficiency).

Characteristics of the non-condensables can include density, viscosity, temperature, and volume, among others. The characteristics of the non-condensables can quantify the non-condensable's resistance to flow. For example, viscosity is the measurement of the internal fluid resistance of a substance, and higher viscosities indicate a greater resistance to flow, while low viscosities indicate less resistance to flow. The lower the viscosity, the increased leaking or flowing of non-condensables at a higher rate.

The differential pressure of the evaporator, the purge exhaust rate, and the characteristics of the non-condensables, can be used to determine the evaporator leak size. The leak size can be calculated based on the amount of non-condensables removed by the purge system that operates at a particular efficiency when under a particular differential pressure of the evaporator. Since the leak size of the evaporator is the combination of the leak paths that can be characterized as a particular leak size for a period of time, the leak paths of the evaporator can be a calculated leak size. The evaporator leak size can be calculated and/or correspond to a particular sized leak orifice.

At box 38, the chiller unit 10 is in the idle vacuum condition. When the chiller unit 10 is in the idle vacuum condition, the evaporator (e.g., 16 in FIG. 1) and condenser (e.g., 14 in FIG. 1) are both in vacuum and can be at the same pressure. Overall, the chiller unit 10 can have a negative pressure relative to the surrounding atmosphere.

At box 40, the chiller unit vacuum and purge exhaust rate can be measured. The chiller unit 10 vacuum can be measured by one or more of the plurality of sensors or pressure transducers (e.g., 30 in FIG. 1). One or more of the plurality of sensors can measure a pressure of the chiller unit in pounds per square inch vacuum (PSIV).

As previously described, the purge system can operate in any of the vacuum conditions and can remove non-condensables from the chiller unit 10. The purge system can include a purge amount and a purge exhaust rate. The purge amount includes the pumpout amount of non-condensables, working fluid, other fluids (e.g., oil), or a combination thereof vented from the purge system via the exhaust vent. The purge system can include a calculated purge emissions (e.g., working fluid loss rate; pounds/time) based on the measured purge rate as factored by a purge efficiency and time. In other words, the purge emissions (e.g., working fluid loss through the purge) is the purge exhaust rate (e.g., pounds) of non-condensables vented (e.g., emitted) through the exhaust vent by the purge system factored by the particular purge efficiency within a period of time.

At box 42, a leak size associated with the chiller unit 10 can be calculated based on differential pressure, purge exhaust rate, and characteristics of the non-condensables. The chiller unit leak size is the combination of the leak paths which can be characterized in a manner that is similar to a particular leak size for a period of time. The chiller unit leak size can be calculated based on the differential pressure of the chiller unit, purge exhaust rate when the vacuum condition of the chiller unit is idle, and characteristics of the non-condensables. For example, the differential pressure and purge exhaust rate can be measured by a sensor and/or calculated, while the characteristics of the non-condensables can be known. Each of these aspects can be known and/or determined by a sensor, and/or a calculation. These features are discussed in detail as follows.

Differential pressure of the chiller unit is the difference between the pressure of the chiller unit and the pressure external to the chiller unit. When the vacuum condition of the chiller unit 10 is idle, the evaporator and the condenser can each have a pressure. In other words, each side of the chiller unit can have a pressure. The pressure for each side (e.g., condenser, evaporator) of the chiller unit can be measured by a sensor (e.g., 30, transducers, etc.). That is, a sensor, among the plurality of sensors, for each side of the chiller unit can measure a respective pressure. For example, a first sensor (e.g., 30-1 in FIG. 1) can measure a pressure associated with the condenser, while a second sensor (e.g., 30-2 in FIG. 1) can measure a pressure of the evaporator. When the chiller is idle, the pressures can be equal. The pressure of either side of the chiller unit forms a pressure for the chiller unit 10 as a whole.

A pressure outside of the chiller unit (e.g., external atmosphere) can be measured or can be assumed to be constant. The pressure external to the chiller unit can be measured by another sensor. For example, a sensor can measure an ambient pressure outside of the chiller unit.

The differential pressure of the chiller unit is the difference between the pressure of the chiller unit (e.g., pressure of the condenser and evaporator) and the pressure external to the chiller unit. Since the chiller unit is operating under vacuum, the differential pressure of the chiller unit can have a negative pressure (e.g., low pressure).

The purge exhaust rate is the amount of non-condensables vented from the purge system via the exhaust vent over a period of time. The purge system can include purge factors. The purge factors can operate on a set of known factors, such as efficiency of the purge. The purge efficiency can indicate the amount of working fluid lost by the purge per pound of non-condensables removed from the chiller unit. The purge system is generally an efficient system. The purge amount can be, in some instances, 0.02 pounds of the non-condensables per pound of air (e.g., approximately 98% or better efficiency).

Characteristics of the non-condensables can include density, viscosity, temperature, and volume. The characteristics of the non-condensables can be known, for example, based on the type of atmospheric constituents, their temperature, pressure, and/or external factors. The characteristics of the non-condensables can quantify the non-condensable's resistance to flow. For example, viscosity is the measurement of the internal fluid resistance of a substance, and higher viscosities indicate a greater resistance to flow, while low viscosities indicate less resistance to flow. The lower the viscosity, the increased leaking or flowing of non-condensables at a higher rate.

The differential pressure of the chiller unit, the purge exhaust rate when the vacuum condition of the chiller unit is idle, and the characteristics of the non-condensables, can be used to determine the chiller unit leak size. In an embodiment, the non-condensables can be removed by the purge system that operates at a particular efficiency when under a particular differential pressure of the chiller unit. Since the chiller unit leak size is a combination of leak paths which can be characterized as a particular leak size for a period of time, the leak paths of the chiller unit can be a calculated leak size.

The non-condensables can be removed by the purge system operating at a particular exhaust rate when under a particular differential pressure when the chiller unit is idle. For example, the leak inside the evaporator may be 0.7 pounds, while the purge system purges 0.5 pounds of non-condensables. There is a 0.2 pound difference between the leak into the chiller unit 10 and the purge efficiency. Based on the difference, an amount of working fluid lost in the purge can be determined to be 0.2 pounds. That is, expected purge exhaust rate may be 0.7 pounds, but the purge amount is 0.5 pounds. The 0.2 pound difference is the purge efficiency (e.g., working fluid lost in the purge).

At box 44, a condenser leak size can be calculated. The condenser leak size can be calculated by subtracting the evaporator leak size (e.g., box 36) from the chiller unit leak size (e.g., box 42). Since the chiller unit is comprised of two sides, a condenser side and an evaporator side, the difference between the chiller unit leak size and the evaporator leak size can impute a leak size associated with the condenser. As such, the evaporator leak size can be subtracted from the chiller unit leak size to determine a condenser leak size. In other words, the condenser leak size is equal to the chiller unit leak size less the evaporator leak size.

At box 46, a working fluid emissions rate can be calculated for a chiller unit. The working fluid emissions rate is based on a respective leak size, respective differential pressure, and characteristics of working fluid, as discussed further with respect to FIG. 4.

As previously mentioned, once the leak size is determined for the chiller unit and one side of the chiller unit, a leak size can be imputed to the other side of the chiller unit by comparing the non-condensable leak rate of the chiller unit in complete vacuum as compared to when one, but not both, the evaporator and condenser are in vacuum. In some embodiments, it may be beneficial to determine a leak size of an evaporator when the vacuum condition of the chiller unit 10 does not place the evaporator under vacuum (e.g., operating).

To determine a leak size associated with the evaporator, the vacuum condition of the chiller unit 10 may include a free cooling vacuum condition and an idle vacuum condition. When the chiller unit 10 is in the free cooling vacuum condition, the chiller unit 10 may have the condenser in vacuum, whereas a chiller unit 10 that is idle may have both the evaporator and condenser in vacuum. Using these two vacuum conditions (e.g., free cooling and idle), a leak size can be imputed to the evaporator of the chiller unit 10 by comparing the non-condensable leak rate of the chiller unit 10 in complete vacuum (e.g., idle) as compared to when the condenser is in vacuum (e.g., operating).

At box 48, the vacuum condition of the chiller unit 10 is free cooling. When the chiller unit is in the free cooling 48 vacuum condition, the condenser (e.g., 14 in FIG. 1) is operating in a vacuum, (e.g., negative pressure). When the chiller unit 10 is in the free cooling vacuum condition, the evaporator (e.g., 16 in FIG. 1) may not be under vacuum.

The vacuum difference can create different pressurized environments between the two sides of the chiller unit 10. The condenser in vacuum can create a low pressure environment, while the evaporator can be a high pressure environment (e.g., positive pressure) relative to the surrounding atmosphere. When the vacuum condition of the chiller unit is free cooling 48, the evaporator and the condenser are no longer coupled, meaning the evaporator and the condenser are both no longer in the same vacuum. The condenser is in negative pressure, while the evaporator is in positive pressure.

At box 50, the condenser vacuum and purge exhaust rate can be measured. The pressure associated with the condenser under vacuum can be measured via one or more of the plurality of sensors (e.g., 30), as previously discussed with respect to FIG. 1. The condenser vacuum can be measured by the sensor or pressure transducers to determine a pressure associated with the evaporator. The condenser vacuum can be measured in units of pounds per square inch vacuum (PSIV).

As previously described herein, the purge exhaust rate is the amount of non-condensables vented through the exhaust vent (e.g., 28 in FIG. 1). The purge exhaust rate can be measured by a sensor and/or a controller (e.g., 82 in FIG. 1) associated with a purge system of the chiller unit 10. As previously described with respect to FIG. 1, the purge system (e.g., 26 in FIG. 1) can operate in any of the vacuum conditions and can remove non-condensables from the chiller unit 10. A purge exhaust rate (e.g., pounds/time) is the purge amount (e.g., pounds) of non-condensables vented (e.g., emitted) through the exhaust vent by the purge system at a particular efficiency within a period of time.

At box 52, when the chiller unit is in the free cooling vacuum condition, the condenser is in vacuum, and a leak size associated with the condenser can be calculated. The leak size is the combination of the leak paths which can be characterized in a manner that is similar to a particular leak size for a period of time. The leak size associated with the condenser can be calculated based on the differential pressure, purge exhaust rate, and characteristics of the non-condensables. For example, the differential pressure and purge exhaust rate can be measured by a sensor and/or calculated, while the characteristics of the non-condensables can be known. Each of these aspects can be determined by a sensor and/or calculation. These features are discussed in detail as follows.

The differential pressure of the condenser can be determined by one or more of the plurality of sensors or pressure transducers (e.g., 30 in FIG. 1). A sensor (e.g., second sensor 30-1 in FIG. 1) can measure a pressure associated with the condenser. The condenser pressure can be compared to a pressure outside of the chiller unit, such as the external atmosphere. The differential pressure is the difference between the two pressures. For example, the differential pressure of the condenser is the difference between the pressure associated with the condenser (e.g., low side differential) and the pressure of the external atmosphere. The difference between the two pressures can be the differential pressure of the condenser under vacuum.

The purge exhaust rate is the amount of non-condensables vented from the purge system via the exhaust vent over a period of time (e.g., box 34). The purge system can include purge factors. The purge factors can operate on a set of known factors, such as efficiency of the purge. The purge efficiency can indicate the amount of working fluid lost by the purge per pound of non-condensables removed from the chiller unit. The purge system is generally an efficient system. The purge amount can be, in some instances, 0.02 pounds of non-condensables per pound of air (e.g., approximately 98% or better efficiency).

Characteristics of the non-condensables can include density, viscosity, temperature, and volume. The characteristics of the non-condensables can be known, for example, based on the type of atmospheric constituents, their temperature, pressure, and/or external factors. The characteristics of the non-condensables can quantify the non-condensable's resistance to flow. For example, viscosity is the measurement of the internal fluid resistance of a substance, and higher viscosities indicate a greater resistance to flow, while low viscosities indicate less resistance to flow. The lower the viscosity, the increased leaking or flowing of non-condensables at a higher rate.

The differential pressure of the condenser, the purge exhaust rate, and the characteristics of the non-condensables, can be used to determine the condenser leak size. In an embodiment, the non-condensables can be removed by the purge system that operates at a particular efficiency when under a particular differential pressure of the condenser. Since the leak size of the condenser is the combination of the leak paths which can be characterized as a particular leak size for a period of time, the leak paths of the condenser can be a calculated leak size. The condenser leak size can be calculated and/or correspond to a particular leak size.

As previously described herein, a leak size associated with the chiller unit 10 can be calculated when the vacuum condition of the chiller unit is idle 38. The chiller unit leak size can be based on differential pressure, purge amount, and characteristics of the non-condensables at box 42. For simplicity of this specification, the idle vacuum condition at box 38, measurement of the chiller unit at box 40, and the calculation of the chiller unit leak size at box 42, as previously described will not be described in further detail.

In an embodiment, the chiller unit leak size (e.g., box 42) and the condenser leak size (e.g., box 52) can be used to calculate an evaporator leak size.

At box 54, an evaporator leak size can be calculated. The evaporator leak size can be calculated by subtracting the condenser leak size (e.g., box 52) from the chiller unit leak size (e.g., box 42). Since the chiller unit is comprised of two sides, a condenser side and an evaporator side, the difference between the chiller unit leak size and the condenser leak size can impute a leak size associated with the evaporator. As such, the evaporator leak size can be subtracted from the chiller unit leak size to determine an evaporator leak size. In other words, the evaporator leak size is equal to the chiller unit leak size less the condenser leak size.

At box 56, an emissions rate can be calculated for a chiller unit. The emissions rate can be a working fluid emission rate. The working fluid emission rate is based on a respective leak size, respective differential pressure, and characteristics of working fluid, as discussed further with respect to FIG. 4. As discussed with respect to FIG. 4, an emissions rate for a chiller unit can be determined from the leak size associated with the chiller unit, evaporator, and condenser.

Figure 3:
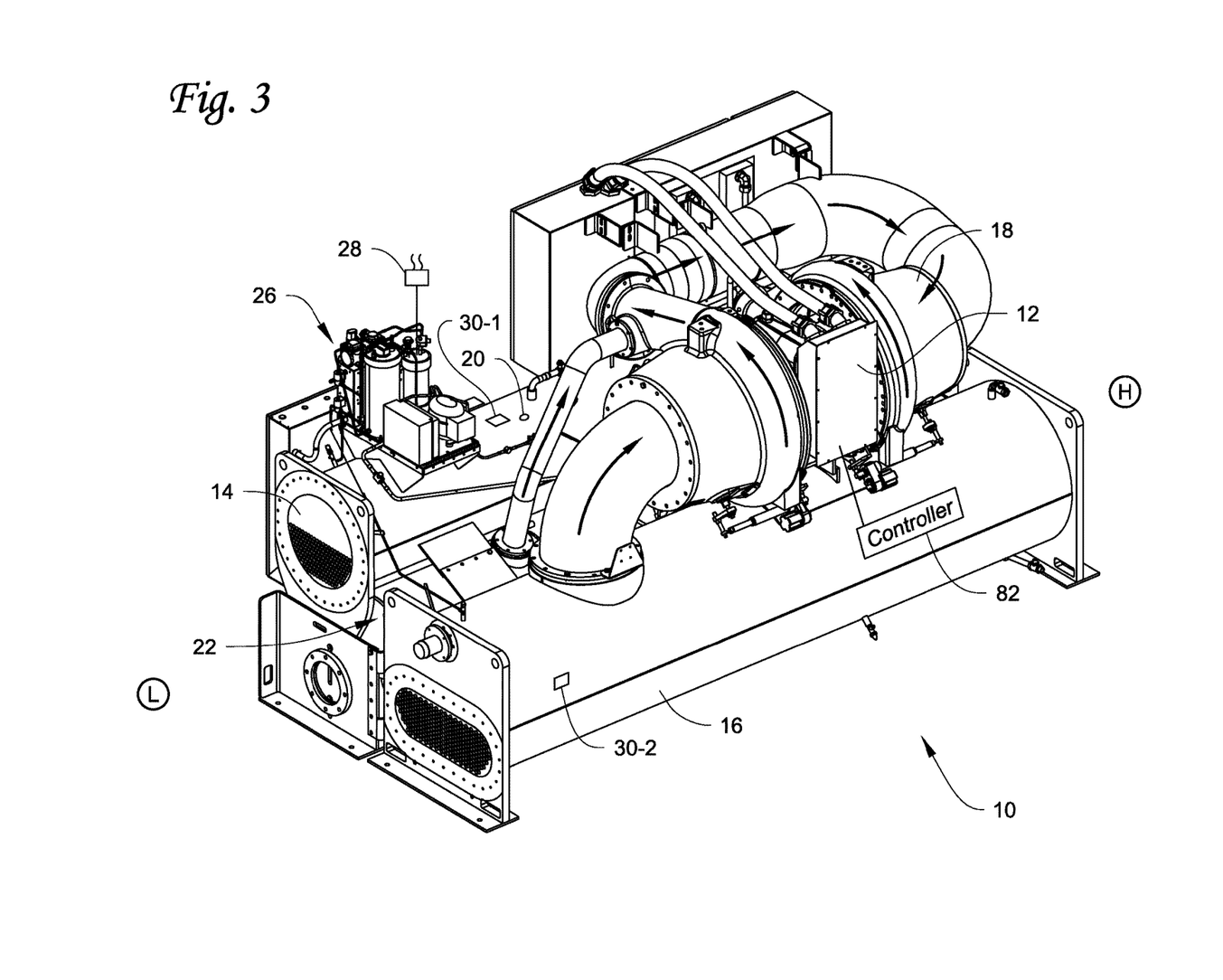
FIG. 3 illustrates a perspective view of a fluid compression system with a leak on the condenser side, according to an embodiment.

FIG. 3 illustrates a perspective view of a fluid compression system with a leak on the condenser side, according to an embodiment. Features of the fluid compression system can be the same as or similar to features of the chiller unit 10 of FIG. 1. For simplicity of this specification, features previously described will not be described in further detail.

In an embodiment, the chiller unit 10 is a low-pressure chiller under vacuum. The vacuum condition of the chiller unit 10 can be operating. When the chiller unit 10 is operating, the evaporator 16 is in vacuum while the condenser 14 is not in vacuum. The chiller unit 10 can include high pressure H side (e.g., pressure above ambient) and low pressure L side (e.g., pressure below ambient) operations. For example, the chiller unit 10 can have the evaporator 16 in vacuum (e.g., low pressure) and the condenser 14 in positive pressure (e.g., high pressure).

A purge amount and a purge exhaust rate of non-condensables can be determined for a chiller unit 10, as previously described. The purge exhaust rate can be used to define an expected purge rate. The expected purge rate is a prediction of an amount of non-condensables that are to be removed from the chiller unit 10 by the purge system 26 over a period of time.

The expected purge rate can be used to determine whether a leak 20 is present on the condenser 14 of the chiller unit 10. For example, a variation in the purge exhaust rate from the expected purge rate can indicate a new leak and/or a leak 20. That is, an actual amount compared to an expected amount. As the working fluid and/or air travels through the chiller unit 10 in high pressure (e.g., operating) within the condenser 14 and compressor 18, the purge exhaust rate can be measured and compared to the expected purge rate when the condenser 14 and compressor 18 are in a vacuum /low pressure (e.g., idle). A reduction of the purge exhaust rate as compared to the expected purge rate may infer that a leak 20 is on the condenser 14 side (e.g., the high pressure H) of the chiller unit 10.

The expected purge rate can be used to determine whether the non-condensables are remaining in the chiller unit 10 or escaping without being purged by the purge system 26. For example, if the amount of non-condensables being purged from the purge system 26 is less than the expected purge rate, a leak 20 may be emitting refrigerant and/or air outside of the chiller unit 10. As the working fluid and/or air are released from the leak 20 and not through the purge system in the chiller unit 10, the purge exhaust rate can decrease.

When the expected purge rate decreases (e.g., reduction), a leak 20 associated with the condenser 14 of the chiller unit 10 may be assumed to be present. In other words, when the expected purge rate decreases, the condenser 14 operating under high pressure is assumed to have the leak 20 that is expelling refrigerant and/or air external to the chiller unit 10. Alternatively, when the expected purge rate is not decreased (e.g., does not change), it can be assumed that the leak (e.g., 20) is not in the condenser 14 but that there is a leak into the evaporator 16 (e.g., under acceptable conditions).

Although the chiller unit 10 of FIG. 3 illustrates an evaporator 16 in low pressure L and condenser in high pressure H, the pressures associated with each side of the chiller unit 10 can vary in different embodiments. In some examples, such as when the vacuum condition of the chiller unit 10 is free cooling, the pressures associated with the sides of the chiller unit 10 can be switched (e.g., condenser 14 in low pressure, evaporator 16 in high pressure). Under such a scenario, a leak can be imputed to the side of the chiller unit 10 that is not under vacuum (e.g., evaporator 16).

The leak 20 can have a working fluid (e.g., refrigerant) emissions rate. The working fluid emission rate is the amount of working fluid (e.g., refrigerant) that is leaking outside of the chiller unit 10 via the leak 20. The working fluid emissions rate can be determined based on a leak size, differential pressure, and working fluid characteristics, as discussed further herein with respect to FIG. 4.

Figure 4:
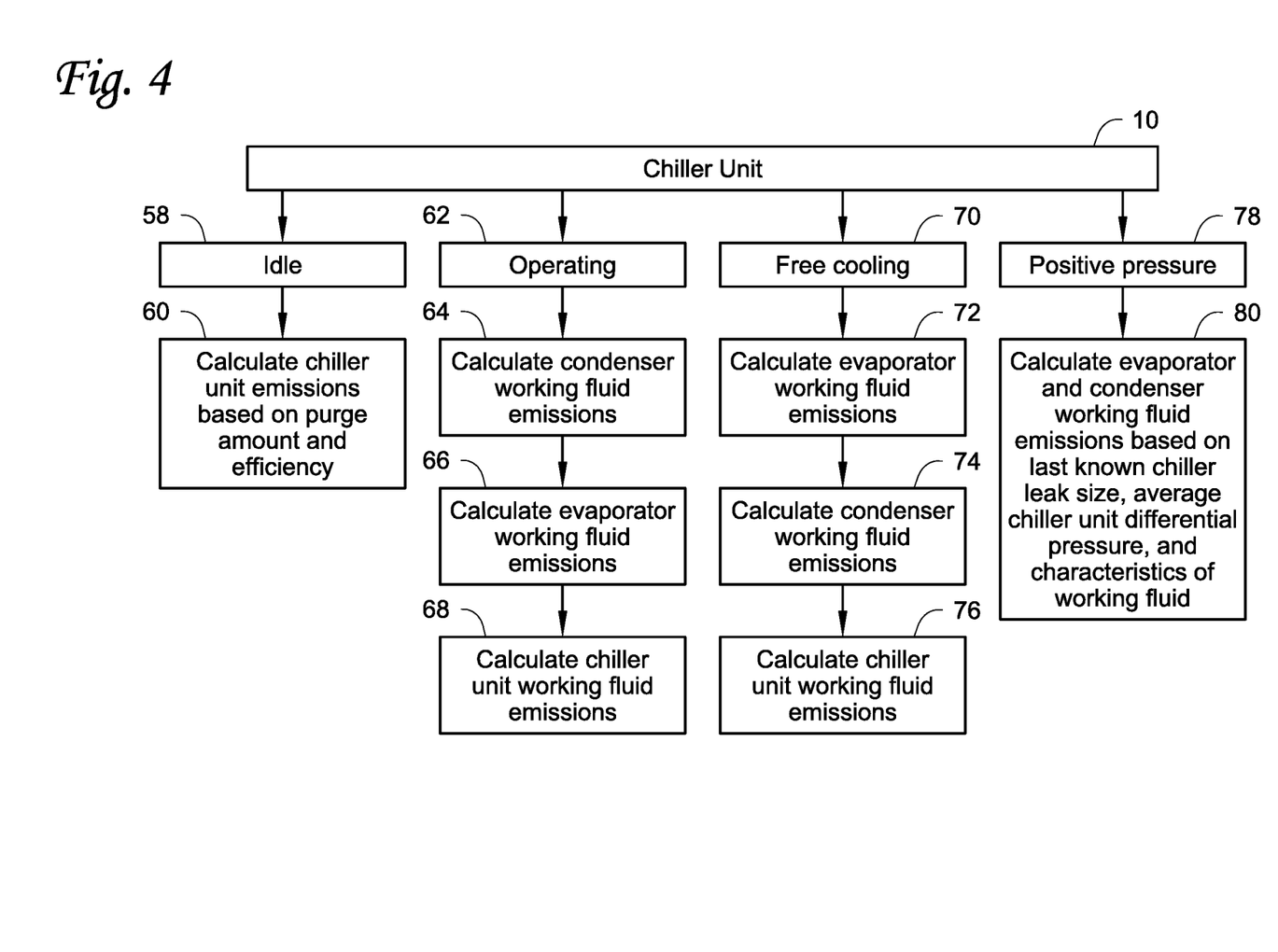
FIG. 4 illustrates a flow diagram of determining an emissions rate in a fluid compression system, according to an embodiment.

FIG. 4 illustrates a flow diagram of determining an emissions rate in a fluid compression system, according to an embodiment. In particular, FIG. 4 depicts a chiller unit conditions, including idle 58, operating 62, free cooling 70, and positive pressure 78 (e.g., no vacuum), and an associated emissions rate.

In an embodiment, the emission rate can be the amount of refrigerant lost through a leak as well as the refrigerant that is emitted by the purge system. The working fluid emissions rate can be calculated in pounds per unit of time (e.g., pounds per day).

At box 10, a chiller unit 10 includes two sides: an evaporator and a condenser. Features of the chiller unit 10 can be the same as or similar to features of the chiller unit 10 of FIG. 1. The chiller unit 10 can have a plurality of chiller unit conditions. Each of the plurality of chiller unit conditions can include one of the plurality of vacuum conditions, as previously described. For example, each of the plurality of chiller unit conditions can include a different vacuum condition: idle, operating, free cooling, and no vacuum (shown as positive pressure). The chiller unit conditions can have the vacuum conditions of the chiller unit 10 in which both the condenser and evaporator in vacuum (e.g., idle vacuum condition), or either the condenser or evaporator, but not both, in vacuum (e.g., operating or free cooling vacuum conditions), or neither the evaporator or condenser in vacuum (e.g., no vacuum condition or "positive pressure").

As illustrated by FIG. 4, an emissions rate for a chiller unit 10 can be determined for each chiller unit condition. The emission rate can be a working fluid emission rate. The working fluid emission rate is the amount of working fluid (e.g., refrigerant) that is leaking outside of the chiller unit 10 from a leak over time. In an embodiment, the working fluid emission rate can be determined based on a leak size, differential pressure, and working fluid characteristics.

At box 10, a chiller unit can include a plurality of chiller unit conditions (e.g., 58, 62, 70, and 78). Features of the chiller unit 10 can be the same as or similar to aspects of the chiller unit 10 of FIG. 1. For simplicity of this specification, features previously described will not be described in further detail.

At box 58, the chiller unit condition is idle. The idle chiller unit condition can include an idle vacuum condition. The idle vacuum condition is when both the evaporator and the condenser are in complete vacuum. Complete vacuum can be when both sides of the chiller unit are in the same vacuum. In some embodiments, although the condenser and the evaporator are in the same vacuum, both may not be at the same pressure. For example, while in complete vacuum, the condenser may have a slightly higher pressure relative to the evaporator which may have a slightly lower pressure. Overall, during a period of complete vacuum, the chiller unit is in negative pressure.

At box 60, the chiller unit emissions rate can be calculated. Generally, fluids will flow from positive to negative pressure. Since the chiller unit 10 has an overall negative pressure relative to the surrounding atmosphere that is positive (e.g., high pressure), working fluid may not leak out of the chiller unit 10. Rather, a leak in the chiller unit under negative pressure may have non-condensables entering the chiller unit. The non-condensables can displace working fluid in the chiller unit, which can decrease chiller unit efficiency. Since working fluid is not leaking out of the condenser, the working fluid emissions rate is equal to the purge amount and purge efficiency.

When the chiller unit condition is idle, which includes an idle vacuum condition, the emission rate is based on a purge amount and a purge efficiency of the purge system. The non-condensables entering the chiller unit can be purged by the purge system through the exhaust vent. The purge amount includes the amount of non-condensables, working fluid, other fluids (e.g., oil), or a combination thereof removed by the purge system. The purge system includes a purge efficiency. The efficiency of the purge can indicate the amount of working fluid lost during purging compared to the amount of non-condensables removed from the chiller unit during purging. As previously mentioned, the purge system is generally an efficient system. The purge amount can be, in some instances, 0.02 pounds of non-condensables per pound of air (e.g., approximately 98% or better efficiency). The amount non-condensables purged and the purge efficiency equals the chiller unit emissions rate when the chiller unit is idle.

At box 62, the chiller unit condition is operating. The operating chiller unit condition includes an operating vacuum condition. When the chiller unit condition is operating, the evaporator is in vacuum, while the condenser is in positive pressure relative to the atmosphere. Since the condenser is in positive pressure, working fluid can leak outside of the chiller unit 10.

At box 64, the condenser working fluid emissions rate can be calculated. The condenser working fluid emissions rate can be calculated based on a leak size, differential pressure, and characteristics of the working fluid. These factors can determine how much working fluid escapes through the leak associated with the condenser under a particular pressure, as discussed in detail below.

The condenser leak size is the "size" of the leak on the condenser. The condenser leak size can be imputed based upon the difference in purge amount when a vacuum condition of the chiller unit is idle and then operating. As previously described with respect to box 44 in FIG. 2, the condenser leak size can be calculated from the chiller unit leak size and evaporator leak size. The condenser leak size is equal to the chiller unit leak size minus the evaporator leak size, thereby imputing the condenser leak size.

The pressure of the condenser can be determined by one or more of the sensors or pressure transducers (e.g., 30 in FIG. 1). A sensor (e.g., second sensor 30-1 in FIG. 1) can measure a pressure associated with the condenser. The pressure of the condenser can be compared to a pressure outside of the chiller unit, such as the external atmosphere. The differential pressure is the difference between the two pressures. For example, the differential pressure of the condenser is the difference between the pressure of the condenser and the pressure of the external atmosphere. The difference between the two pressures is the condenser differential pressure.

Characteristics of the working fluid can be the type of refrigerant, pressures associated with the type of refrigerant, temperature, molecular weight, viscosity, and density, among other characteristics. The characteristics of the working fluid can quantify a flow resistance and impact performance. For example, the type of refrigerant may operate in a particular manner at a particular temperature or pressure. Additionally, viscosity is the measurement of the internal fluid resistance of a substance, and higher viscosities indicate a greater resistance to flow, while low viscosities indicate less resistance to flow. The lower the viscosity means the increased leaking or flowing of the working fluid at a higher rate.

The condenser working fluid emissions rate is concerned with the condenser side of the chiller unit. The condenser working fluid emissions rate is based on the condenser leak size, condenser differential pressure, and characteristics of the working fluid. These factors can be used to calculate an amount of working fluid under a particular amount of pressure that can escape from a particular sized leak associated with the condenser.

At box 66, the evaporator working fluid emissions rate may be calculated. Since the evaporator is in vacuum (e.g., negative pressure), non-condensables can leak into the chiller unit on the evaporator side. The evaporator working fluid emissions rate may not be dependent upon the evaporator differential pressure. Additionally, due to the pressure differences, the condenser and the evaporator are no longer coupled, meaning the evaporator and the condenser are both no longer in the same vacuum. The evaporator working fluid emissions rate can be calculated based on purge amount and a purge efficiency of the purge system.

As previously disclosed herein, the non-condensables entering the chiller unit can be purged by the purge system through the exhaust vent. The purge amount includes the amount of non-condensables, working fluid, other fluids (e.g., oil), or a combination thereof removed by the purge system. The purge system includes an efficiency of the purge. The purge efficiency can indicate the amount of working fluid lost during purging compared to the amount of non-condensables removed from the chiller unit during purging. The amount of non-condensables purged and the purge efficiency can be measured by a sensor and/or the controller, as previously described. The purge efficiency is the amount of working fluid lost through the purge, which can be the pounds of working fluid lost per pound of non-condensables exhausted.

At box 68, the chiller unit working fluid emissions rate can be calculated. The working fluid emission rate is the amount of refrigerant lost through a leak. Accordingly, the chiller unit working fluid emissions rate is based on the sum of the condenser working fluid emissions rate and the evaporator working fluid emissions rate. The chiller unit emissions rate is the amount of working fluid expelled from the leak on the condenser and the amount of working fluid emissions from the purge system, the sum of which equals the amount of working fluid exiting the chiller unit in one form or another.

The working fluid emissions rate for a respective component can be calculated as a percent. The working fluid emissions rate can be a percentage of refrigerant emission leaving the chiller unit. The working fluid emissions rate can be useful when determining whether a particular chiller unit 10 is operating efficiently and/or within the Environmental Protection Agency (EPA) standards and/or other environmental standards.

At box 70, the chiller unit condition is free cooling. The free cooling chiller unit condition includes a free cooling vacuum condition. When the chiller unit is in the free cooling vacuum condition, the condenser is in vacuum while the evaporator is in positive pressure, relative to the atmosphere. Although this scenario can occur, generally it occurs less often than when the evaporator is in vacuum and the condenser is in positive pressure (e.g., operating chiller unit condition, box 62).

At box 72, the evaporator working fluid emissions can be calculated. The working fluid emissions rate associated with the evaporator can be based on the evaporator leak size, evaporator differential pressure, and the characteristics of the working fluid. That is, the working fluid emissions rate is dependent upon the pressure and characteristics of the working fluid that can travel through the leak size over a period of time.

These factors can determine how much working fluid escapes through the leak associated with the evaporator under a particular pressure, as discussed in detail below.

The evaporator leak size is the "size" of the leak on the evaporator. The evaporator leak size can be imputed based upon the difference in purge amount when a vacuum condition of the chiller unit is idle and free cooling. As described above with respect to box 54 in FIG. 2, the evaporator leak size can be calculated from the chiller unit leak size and condenser leak size. The evaporator leak size is equal to the chiller unit leak size minus the condenser leak size, thereby imputing the evaporator leak size.

The pressure of the evaporator can be determined by one or more of the sensors or pressure transducers (e.g., 30 in FIG. 1). A sensor (e.g., second sensor 30-2 in FIG. 1) can measure a pressure associated with the evaporator. The pressure of the evaporator can be compared to a pressure outside of the chiller unit, such as the external atmosphere. The differential pressure is the difference between the two pressures. For example, the differential pressure of the evaporator is the difference between the pressure of the evaporator and the pressure of the external atmosphere. The difference between the two pressures is the evaporator differential pressure.

Characteristics of the working fluid can be the type of refrigerant, pressures associated with the type of refrigerant, temperature, molecular weight, viscosity, and density, among other characteristics. The characteristics of the working fluid can quantify a flow resistance and impact performance. For example, the type of refrigerant may operate in a particular manner at a particular temperature or pressure. Additionally, viscosity is the measurement of the internal fluid resistance of a substance, and higher viscosities indicate a greater resistance to flow, while low viscosities indicate less resistance to flow. The lower the viscosity, the increased leaking or flowing of the working fluid at a higher rate.

The evaporator working fluid emissions rate is concerned with the evaporator side of the chiller unit. The evaporator working fluid emissions rate is based on the evaporator leak size, evaporator differential pressure, and characteristics of the working fluid. These factors can be used to calculate an amount of working fluid under a particular amount of pressure that can escape from a particular sized leak associated with the evaporator.

At box 74, a condenser working fluid emissions rate can be calculated. Since the condenser is in vacuum (e.g., negative pressure), non-condensables may leak into the chiller unit on the condenser side. The condenser working fluid emissions rate may not be dependent upon the condenser differential pressure. Additionally, due to the pressure differences, the evaporator and the condenser are no longer coupled, meaning the evaporator and the condenser are both no longer in the same vacuum. The condenser working fluid emissions rate is based on a purge amount and purge efficiency of the purge system.

As described above, the non-condensables entering the chiller unit can be purged by the purge system through the exhaust vent. The purge amount includes the amount of non-condensables, working fluid, other fluids (e.g., oil), or a combination thereof removed by the purge system. The purge system includes purge efficiency. The efficiency of the purge can indicate the amount of working fluid lost during purging compared to the amount of non-condensables removed from the chiller unit during purging. The amount of non-condensables purged and the purge efficiency can be measured by a sensor and/or the controller, as previously described.

At box 76, a chiller unit working fluid emissions rate can be calculated. The chiller unit working fluid emissions is based on the sum of the evaporator and condenser emissions.

At box 78, the chiller unit condition is positive pressure. A positive pressure chiller unit condition includes no vacuum condition. When the chiller unit has no vacuum, the chiller unit is in positive pressure (e.g., high pressure) while spaces external to the chiller unit are negative (e.g., low pressure). The differential pressure when no vacuum is present can be pressure measured relative to a reference pressure. For example, a pressure outside of the chiller unit, such as an ambient pressure, may be a reference pressure. The differential pressure can be a difference between the pressure in vacuum and ambient pressure, measured in pounds per square inch differential (PSID).

At box 80, the working fluid emissions rate for the evaporator and condenser can be calculated. Since the chiller unit is in positive pressure, both sides of the chiller unit are factored into the working fluid emissions rate calculation. The evaporator and condenser working fluid emission rates are based on the last known total chiller unit leak size, an average differential pressure associated with the chiller unit, and characteristics of the working fluid.

The last known chiller leak size can be calculated based on the chiller unit leak size, chiller unit differential pressure, purge exhaust rate, and characteristics of the non-condensables, as previously described herein with respect to box 42 in FIG. 2. For simplicity of this specification, features previously described will not be described in further detail.

The chiller unit differential pressure can be measured by one or more of the sensors (e.g., 30), as previously described in FIG. 1. The average differential pressure can be calculated by the controller based on historical differential pressures associated with the chiller unit. The historical differential pressures can be averaged to result in an average chiller unit differential pressure.

Additionally, the characteristics of the working fluid can be based on type of refrigerant, pressures associated with the type of refrigerant, temperature, molecular weight, viscosity, and density, among other characteristics, as discussed above.

The chiller unit leak size, average chiller unit differential pressure, and characteristics of the working fluid can be calculated to determine a working fluid emissions rate for the evaporator and condenser.

Detecting leaks in a chiller unit can provide information with respect to working fluid emissions rate (e.g., refrigerant emissions) outside the chiller unit. By determining a location, a leak size, and calculating a working fluid emissions rate, a user can know whether the chiller unit is in compliance with state and/or federal refrigerant emissions guidelines. Detecting leaks in the chiller unit can also identify urgent leaks (e.g., condenser leaks), which can be properly addressed and save money by timely repairing the same. The systems and methods described herein can provide information with respect to leak orifice size and an associated emissions rate of a chiller unit, thereby indicating compliance or non-compliance with regulatory standards.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the foregoing description, it is to be understood that changes may be made in detail, without departing from the scope of the patent invention. It is intended that the specification and depicted embodiments are to be considered exemplary only, with a true scope and spirit of the invention being indicated by the broad meaning of the claims.

What is claimed is:

1. A method for detecting leaks, comprising:
   determining, during a period of vacuum, a purge exhaust rate of non-condensables from a purge system integrated with a chiller unit;
   determining a differential pressure, the differential pressure based on a vacuum side pressure of the chiller unit, wherein the vacuum side pressure includes at least one of a pressure of a condenser and pressure of an evaporator; and
   calculating, via a controller, the purge exhaust rate and the differential pressure to identify a leak size based at least in part on the purge exhaust rate.

2. The method of claim 1, further comprising determining an expected purge rate based on the purge exhaust rate for a vacuum side pressure of the chiller unit upon termination of the period of vacuum.

3. The method of claim 1, wherein a reduction of the purge exhaust rate indicates the leak size is associated with a vacuum side pressure of the chiller unit upon termination of the period of vacuum.

4. The method of claim 1, wherein the differential pressure includes a condenser differential pressure, evaporator differential pressure, and a chiller unit differential pressure, each of which is in reference to surrounding atmospheric pressure.

5. The method of claim 1, further comprising determining a working fluid emissions rate based at least in part on the leak size, purge exhaust rate, and differential pressure, wherein working fluid emissions rate is determined in real time.

6. The method of claim 1, further comprising introducing cold fluid to a respective piping connected to the condenser or the evaporator, wherein the cold fluid serves to cause a period of complete vacuum and to chill the chiller unit.

7. The method of claim 1, wherein the purge system operates when the chiller unit is in complete vacuum, operating, idle, or free cooling vacuum condition.

8. The method of claim 1, further comprising displaying, via the controller, the purge exhaust rate, the differential pressure, and a non-condensables leak rate.

9. The method of claim 1, further comprising automatically quantifying the rate of non-condensables purging and eliminating a manual leak check.

10. A method for detecting leaks in a fluid compression system, comprising:
    operating a purge system in a chiller unit, the purge system operating in a vacuum;
    monitoring an expected purge rate based on a purge exhaust rate;
    detecting, via a pressure sensor on a high side and a low side of the chiller unit, a first respective pressure associated with a condenser and a second respective pressure associated with the evaporator;
    determining a differential pressure based on the first and second respective pressures relative to an external pressure; and
    calculating a leak size based on the purge exhaust rate, differential pressure, and characteristics of non-condensables, wherein the leak size is on the high side of the chiller unit.

11. The method of claim 10, wherein the expected purge rate relative to the purge exhaust rate and differential pressure indicates the severity of the detected leak.

12. The method of claim 10, wherein the leak size on the high side of the chiller unit is an increased severity leak as compared to a detected leak on the low side of the chiller unit, wherein the high side of the chiller unit is a condenser and the low side is an evaporator.

13. The method of claim 10, further comprising determining a working fluid emission rate based on a the leak size, differential pressure, characteristics of working fluid, purge efficiency, and purge amount.

14. The method of claim 10, wherein determining the purge exhaust rate is based in part on detected purge amount.

15. A leak detection system, comprising:
    a purge system connected to a chiller unit, the purge system operates in a vacuum and includes a purge exhaust rate;
    a first pressure sensor associated with a condenser associated with the chiller unit;
    a second pressure sensor associated with an evaporator associated with the chiller unit; and
    a controller in electrical communication with the first and second pressure sensors that calculates a differential pressure;
    the controller determines a condenser leak size based at least in part on the differential pressure;
    the controller calculates a working fluid emission rate based on the differential pressure and the condenser leak size.

16. The leak detection system of claim 15, wherein a decrease in the purge exhaust rate upon removal of vacuum and creation of positive pressure indicates working fluid is leaking outside the chiller unit.

17. The leak detection system of claim 15, wherein the leak size is calculated for the evaporator, condenser, and chiller unit.

18. The leak detection system of claim 15, wherein the refrigerant emissions due to non-condensable purging are calculated based upon purge exhaust rate and purge efficiency.

19. The leak detection system of claim 15, wherein the controller calculates a working fluid emission rate for components at positive pressure based on a respective calculated leak size, working fluid characteristics, and differential pressure to the atmosphere.

20. The leak detection system of claim 15, wherein the controller calculates a working fluid emission rate for each of the chiller unit, evaporator, and condenser.

* * * * *